United States Patent [19]
Khlat

[11] Patent Number: 6,075,409
[45] Date of Patent: Jun. 13, 2000

[54] DEMODULATION METHOD AND ARRANGEMENT

[75] Inventor: Nadim Khlat, Cugneaux, France

[73] Assignee: Motorola, Inc., Schaumburg, Ill.

[21] Appl. No.: 09/285,116

[22] Filed: Apr. 1, 1999

[51] Int. Cl.[7] .............................. H03D 3/00; H04L 27/00
[52] U.S. Cl. .......................... 329/304; 329/300; 329/318; 329/349; 329/353; 375/346; 375/349; 375/350
[58] Field of Search ...................................... 329/300–310, 329/318, 320, 323, 325, 349, 350, 353; 375/317–319, 325, 329–333, 346, 348, 349, 350

[56] References Cited

U.S. PATENT DOCUMENTS

| | | | |
|---|---|---|---|
| 3,568,078 | 3/1971 | Pelchat | 329/110 |
| 3,953,805 | 4/1976 | Couvillon | 328/162 |
| 4,105,975 | 8/1978 | Sanders et al. | 325/320 |
| 4,910,468 | 3/1990 | Ohtsuka et al. | 329/316 |
| 5,157,697 | 10/1992 | Anvari et al. | 375/102 |
| 5,724,653 | 3/1998 | Baker et al. | 455/296 |
| 5,881,376 | 3/1999 | Lundberg et al. | 455/226.1 |
| 5,953,643 | 9/1999 | Speake et al. | 455/324 |
| 6,009,126 | 12/1999 | Van Bezooijen | 375/319 |

*Primary Examiner*—David Mis
*Attorney, Agent, or Firm*—Miriam Jackson

[57] ABSTRACT

A method for demodulating a radio frequency signal having a frequency, by oscillating a demodulator at a frequency different from the signal frequency, and measuring a DC offset value at this different frequency, the DC offset value being associated with interference. Then the demodulator is oscillated at the signal, thereby providing a demodulated signal. The DC offset value is subtracted from the demodulated signal in order to provide a demodulated signal with a substantially reduced DC component. The demodulated signal is then monitored for further DC offset components, and these further DC offset components are subtracted from the demodulated signal.

17 Claims, 3 Drawing Sheets

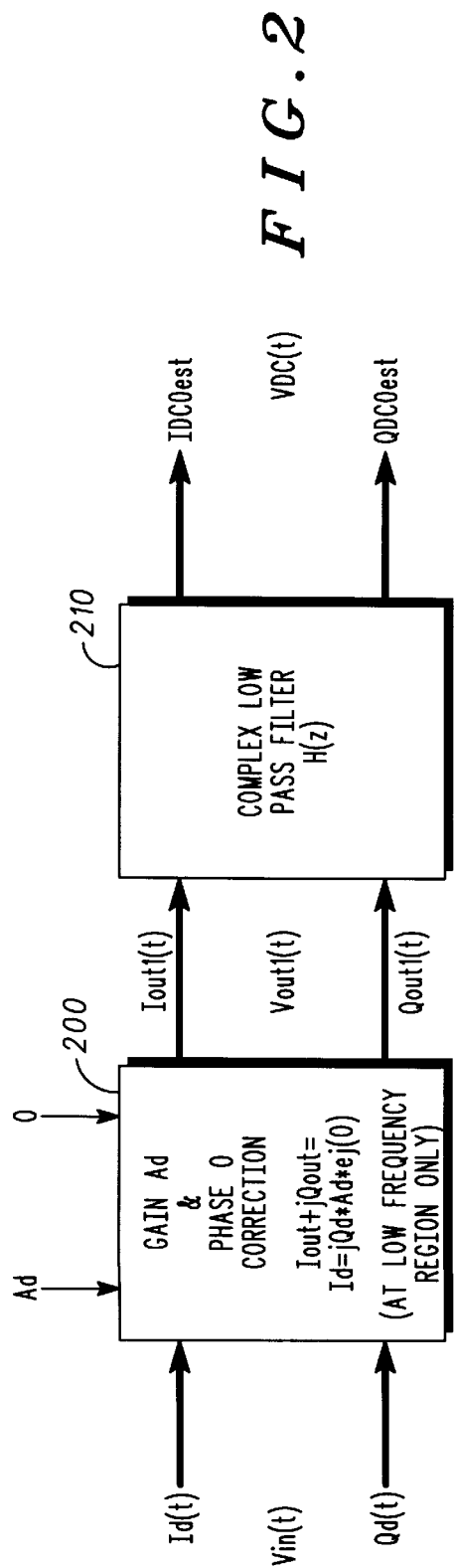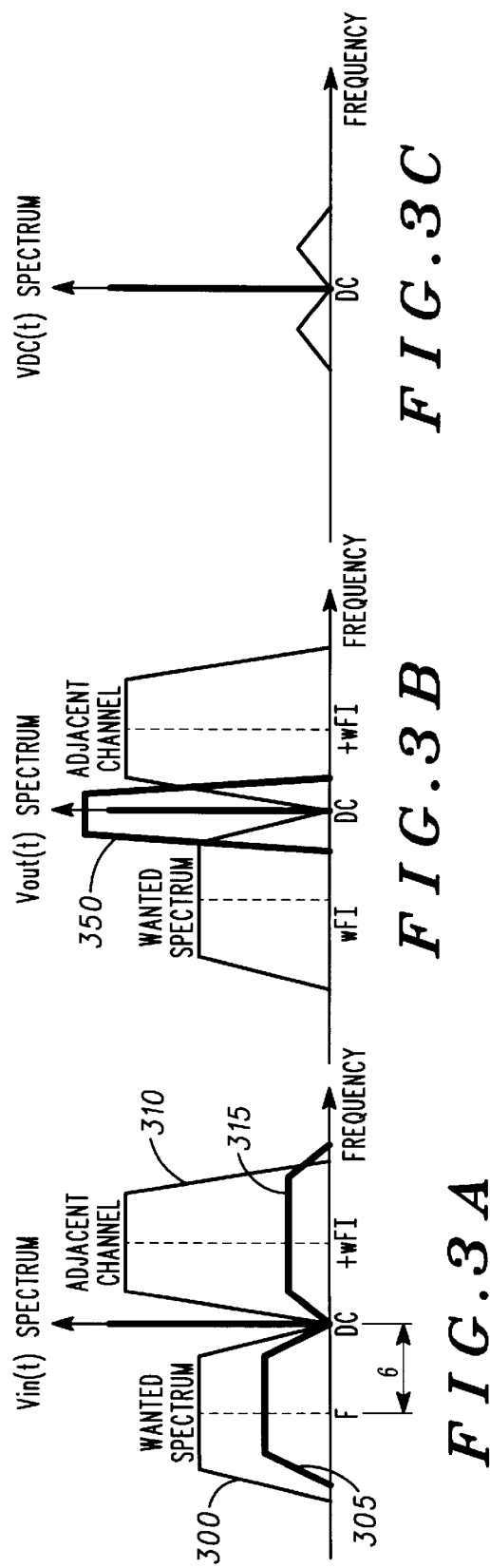

DEMODULATION METHOD AND ARRANGEMENT

FIELD OF THE INVENTION

This invention relates to demodulation methods and particularly but not exclusively to methods for demodulating a Radio-Frequency (RF) signal in a portable communications device.

BACKGROUND OF THE INVENTION

Portable communications devices such as mobile telephones typically operate with a limited power supply in the form of a battery, and hence have a limited period of operation before the battery must be recharged or replaced.

Many efforts are being made to reduce the power consumption of such portable devices, in order to lengthen the above period of operation. When such a portable device is not actively involved in a call, (a so-called standby mode), the device periodically 'listens' to a control channel, which will then alert the device in the case of an incoming call. This is referred to as Discontinuous Receiving Mode (DRX mode). During DRX mode, most power is consumed when the receiver apparatus is actually switched on, and therefore a key goal is to reduce the receiver apparatus 'on' time.

A problem with the receiver apparatus is that whilst receiving and demodulating a signal, Direct Current (DC) interference generated internally interferes with the signal, limiting dynamic range.

A known solution to this problem is to provide in the receiver apparatus, a DC adapt step, prior to demodulating the signal, which substantially cancels the DC interference. However the receiver apparatus must be switched on during this DC adapt step, thereby causing an increased 'on' time of the receiver apparatus and hence resulting in a large power drain.

This invention seeks to provide a demodulation method which mitigates the above mentioned disadvantages.

SUMMARY OF THE INVENTION

According to a first aspect of the present invention there is provided a demodulation method for demodulating a radio frequency signal having a first frequency, comprising the steps of: oscillating demodulation means at a second frequency, the second frequency being different from the first frequency; measuring a DC offset value from the second frequency, the DC offset value being associated with internal interference; oscillating the demodulation means at the first frequency in order to demodulate the radio frequency signal, thereby providing a demodulated signal; subtracting the DC offset value from the demodulated signal in order to provide a demodulated signal with a substantially reduced DC component; monitoring the demodulated signal for further DC offset components; and subtracting the further DC offset components from the demodulated signal.

According to a second aspect of the present invention there is provided a demodulation method demodulation arrangement for demodulating a radio frequency signal having a first frequency, the arrangement comprising: demodulation means arranged to oscillate at the first frequency and at a second frequency, the second frequency being different from the first frequency; filtering means for measuring a DC offset value from the first frequency and from the second frequency, the DC offset value being associated with interference; and subtracting means for subtracting the DC offset value from the demodulated signal in order to provide a demodulated signal with a substantially reduced DC component, wherein the demodulation means initially oscillates at the second frequency such that the filtering means measures a DC offset value substantially dependent upon internal interference.

In this way a demodulation method and arrangement are provided which exhibit reduced power consumption by providing a short DC adapt step which reduces the 'on' time of the receiver (demodulator).

BRIEF DESCRIPTION OF THE DRAWINGS

An exemplary embodiment of the invention will now be described with reference to the drawing in which:

FIG. 2 shows a detailed view of a portion of the embodiment of FIG. 1.

FIG. 3A–3C show a series of frequency diagrams illustrating signals associated with the invention.

DETAILED DESCRIPTION OF A PREFERRED EMBODIMENT

Figure 1:
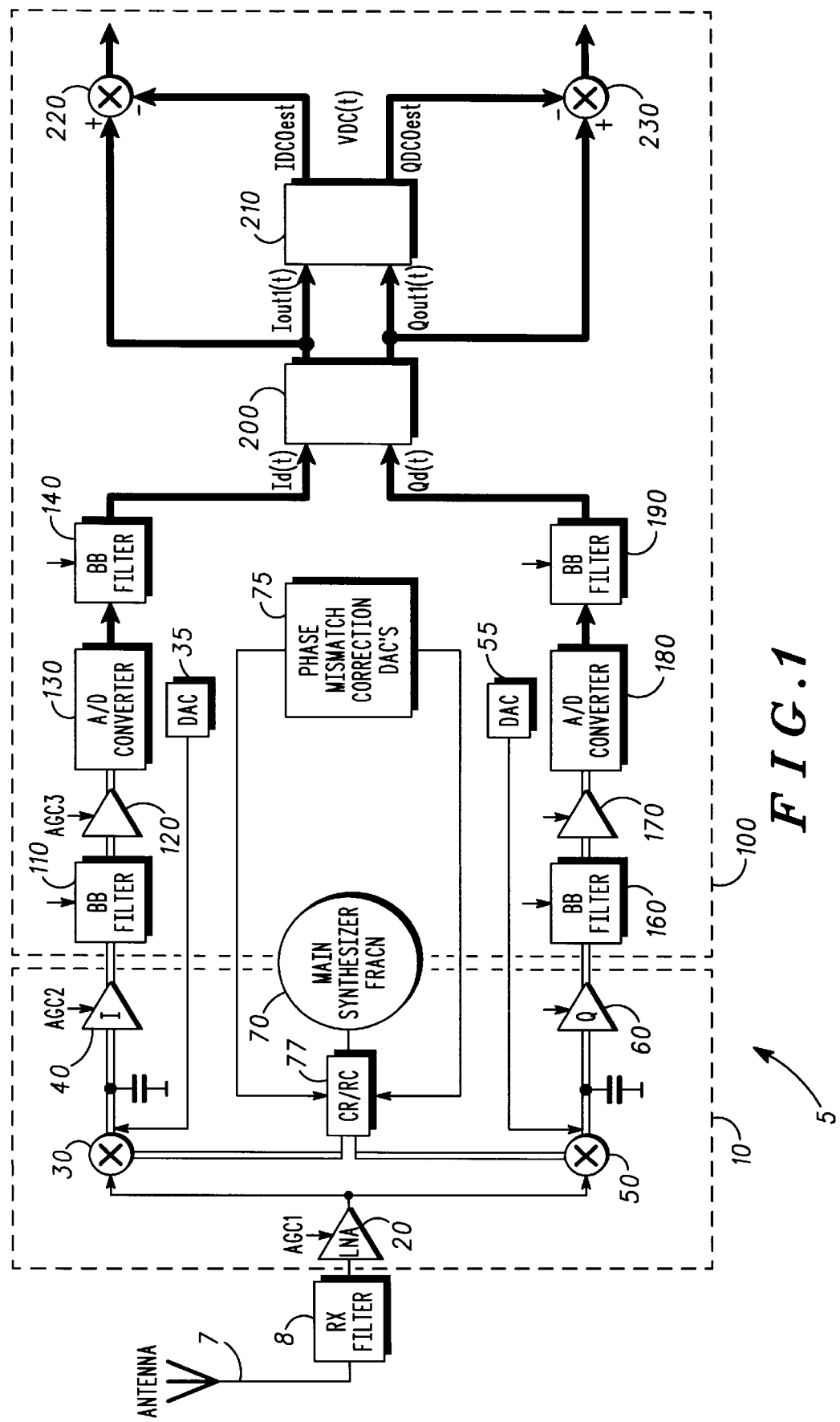
FIG. 1 shows a preferred embodiment of a receiver of a portable communications device in accordance with the invention.

Referring to FIG. 1, there is shown a RF Direct Conversion Receiver (DCR) 5 of a portable communications device. The DCR 5 has an antenna 7, coupled via a receive filter 8 to an amplifier and mixer stage 10, and a low frequency stage 100.

The amplifier and mixer stage 10 has a low noise amplifier with an input coupled to receive a filtered RF signal from the receive filter 8 and an output which is split into two paths. A first path is coupled via a first mixer 30 to a first signal amplifier 40. Similarly a second path is coupled via a second mixer 50 to a second signal amplifier 60.

The first and second mixers 30 and 50 are also coupled to receive sine and cosine components respectively of an oscillating signal from a fractional-N type synthesised oscillator 70. In this way the first and second mixers 30 and 50 and the first and second signal amplifiers 40 and 60 respectively provide in-phase (I) and quadrature (Q) mixed signals which are demodulated components of the RF signal.

First and second Digital-to-Analog Converters (DACs) 35 and 55 provide static offset values for the first and second mixers 30 and 50 respectively, to be further described below. Further DACs 75 provide phase and mismatch correction functions for the fractional-N oscillator 70, via a CR/RC network 77. The CR/RC network is a quadrature network generator that generates cosine and sine components of the fractional-N oscillator 70. The first and second signal amplifiers 40 and 60 each have gain control inputs, for adjusting the gain thereof.

The low frequency stage 100 also has two paths. A first path, which starts from the I signal of the first signal amplifier 40 (the I path) comprises (in sequence) a first bandwidth adjustment filter 110, a first low-frequency amplifier 120, a first Analog-to-Digital (A/D) converter 130 and a first baseband filter 140. The output of the first baseband filter 140 is a signal Id(t).

Similarly the second path, which starts from the Q signal of the second signal amplifier 60 (the Q path) comprises (in sequence) a second bandwidth adjustment filter 160, a second low-frequency amplifier 170, a second A/D converter 180 and a second baseband filter 190. The output of the second baseband filter 190 is a signal Qd(t).

The first and second bandwidth adjustment filters 110 and 160 and the first and second baseband filters 140 and 190 each have filter control inputs, to control the filtering thereof. Similarly the first and second low-frequency amplifiers 120 and 170 each have gain control inputs to control the gain thereof.

Referring now also to FIG. 2, which shows in greater detail a portion of the low frequency stage of FIG. 1, there is provided a gain/phase correction block 200 and a complex low-pass filter (LPF) 210.

The gain/phase correction block 200 is coupled to receive the Id(t) and Qd(t) signals and Gain adjustment (Ad) and Phase (φ) control signals. The block 200 may be realised in hardware or software, and is arranged to provide the following result:

$$Iout+jQout=Id+jQd*Ad*ej(\phi) \qquad \text{Equation 1}$$

where Iout and Qout are gain corrected, phase adjusted I and Q signals. The Ad and φ control signals are factory set, and are intended to remove any phase or gain mismatches occurring between the I and Q paths as a result of analog device variations. Any such mismatches could cause aliasing between channels of the receive spectrum.

The Iout and Qout signals are then filtered by the complex LPF 210 to produce IDCest and QDCest signals representing the DC offset component of the Iout and Qout signals. The IDCest signal is then subtracted from the Iout signal, at a mux block 220. Similarly, the QDCest signal is subtracted from the Qout signal, at a mux block 230. In this way the DC offset component of the Iout and Qout signals are substantially cancelled.

In operation, and referring now also to FIG. 3, a fast DC adapt step is achieved as follows. For desired demodulation of a frequency f, the fractional-N oscillator 70 is first set to a frequency F=f+∂, where ∂ is an appropriate offset value. In FIG. 3a, there is shown a wanted spectrum 300 centred on the frequency f, and an adjacent channel spectrum 310. Gain and phase mismatches between the I and the Q paths result in aliased images of the wanted spectrum 300 and the adjacent channel spectrum 310, which appear as images 315 (image of the wanted spectrum 300) and 305 (image of the adjacent channel spectrum 310). The offset ∂ is chosen in this case to be half of the bandwidth of the wanted spectrum 300, such that the initial oscillation frequency F (=f+∂) is outside of the wanted spectrum 300, and also clear of the adjacent channel 310. A vector Vin(t) at the frequency F, represents the DC offset derived from Id(t) and Qd(t).

FIG. 3b shows a second vector Vout(t) (derived from Iout and Qout) representative of the gain and phase corrected DC offset. The gain and phase correction substantially removes the images 305 and 310 from the adjacent channel 310 and the wanted spectrum 300 respectively. A wideband envelope 350 of FIG. 3b represents the wideband filtering to be performed by the complex LPF 210. FIG. 3c then shows the result of this filtering, in the form of a third vector VDC(t) (derived from IDCest and QDCest) which represents the DC offset.

The DC offset value is based on a measurement shifted from the frequency f, and is therefore almost exclusively the result of internal interference. Also, it is possible during the fast DC adapt mode, to effectively switch off the amplifier and mixer stage 10, by switching off or reducing the gain of the LNA 20 in order to reduce the levels of wanted signals and adjacent channels versus the DC offsets. This RF isolation is of interest during the static DC offset value estimation.

The fractional-N oscillator 70 is then set to oscillate at the frequency f, in order to provide the desired demodulated signal. The DC offset value given by IDCest and QDCest is then subtracted from the demodulated signal in order to provide a demodulated signal with a substantially reduced DC component.

The blocks 200 and 210 then continue to provide further DC offset values, which are subtracted to further reduce the amount of DC offset present in the demodulated signal. However, the complex LPF 210 may be adjusted so as to have a different filter envelope to the wideband envelope 350 shown in FIG. 3b. In particular, the complex LPF 210 may, when filtering the demodulated signal, define a narrowband envelope.

The first and second DACs 35 and 55 may be arranged to store the results of the fast DC adapt step described above, such that when the same wanted frequency is demodulated at a later time, the DACs 35 and 55 can provide appropriate static offset values for the first and second mixers 30 and 50 respectively, such that the fast DC adapt step need not be performed every time the wanted frequency is demodulated.

Figure 4:
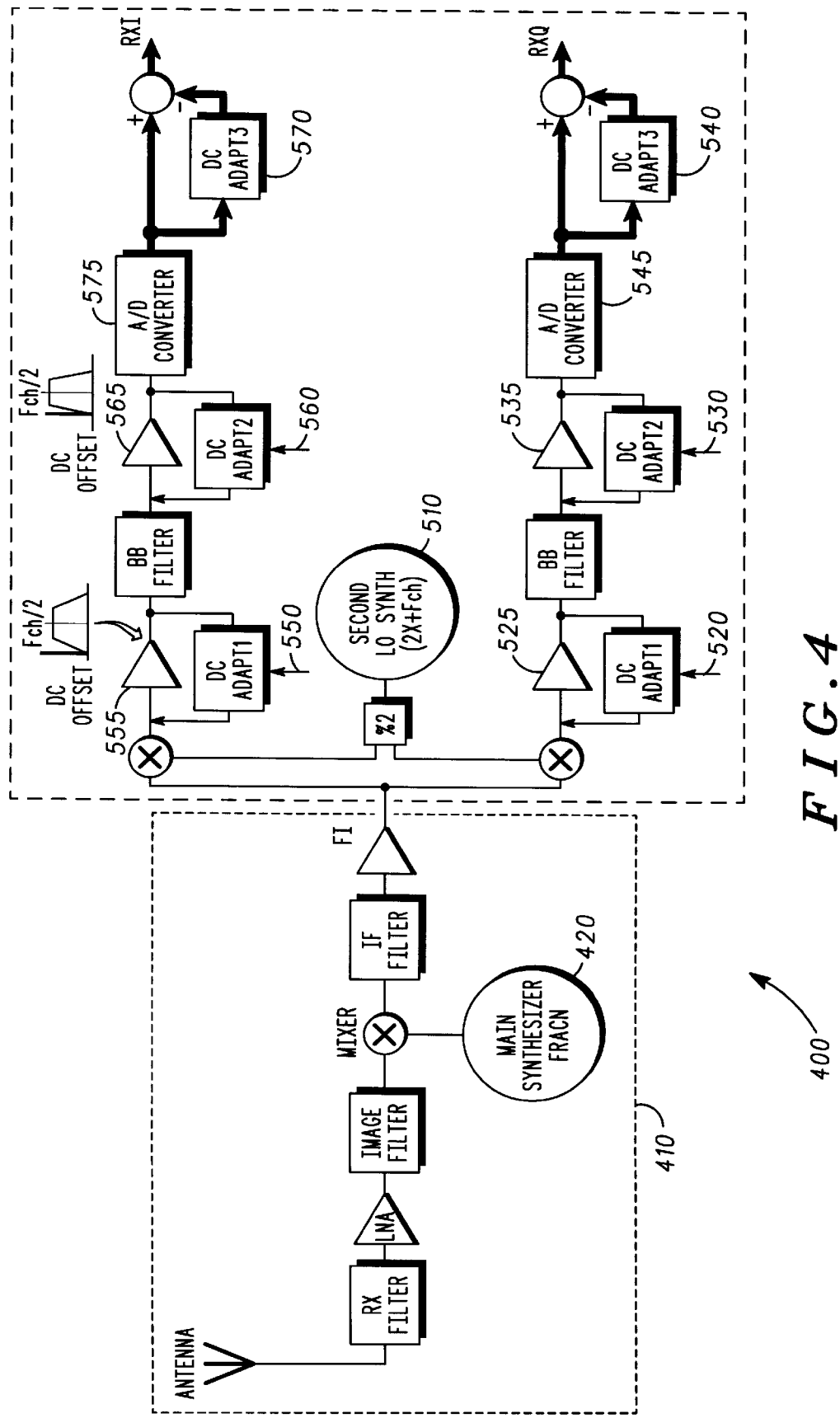
FIG. 4 shows an alternative embodiment of a receiver of a portable communications device in accordance with the invention.

Referring now also to FIG. 4, there is shown a zero-IF (ZIF) RF receiver 400 of a portable communications device.

The ZIF RF receiver 400 differs from the DCR receiver 100 of FIG. 1 in that the demodulation takes place in two stages, and there are two oscillators. A first stage 410 comprises a main synthesiser 420, which demodulates a received signal to an intermediate frequency (IF).

The second stage 500 has a second oscillator 510, which is a low-order fractional-N synthesiser, coupled to provide oscillation signals to first and second mixers 520 and 530. The first and second mixers 520 and 530 split the IF signal from the first stage 410 into two paths, an I path and a Q path, similar to those of FIG. 1. The use of a similar approach to DCR in ZIF receiver 400 as in DCR is possible. However, a different type of cancellation is required for the ZIF receiver 400.

The IF signal will always be at the same frequency (the intermediate frequency) and therefore the second oscillator 510 need only have two oscillation frequencies; the IF (for demodulation) and IF+∂ (for the DC adapt step). During the fast DC adapt, the second oscillator 510 is shifted in frequency to IF+∂.

The DC adapt is performed by a number of DC adapt blocks. DC adapt feedback blocks 520, 530, 550 and 560 are coupled to provide DC offset feedback cancellation for amplifiers 525, 535, 555 and 565.

The DC adapt block 550 estimates the DC offsets of the first stage 410 through the use of a low pass filter (in a wideband configuration). This estimated DC offsets is compared to zero. The resulting error is integrated by an integrator and feedback to the input of the amplifier 555. This forms a DC adapt loop which will converge to zero DC output after a response time.

After the fast DC adapt step is performed, the second oscillator 510 switches to the IF and the low pass filter of the DC adapt block 550 is set to a narrowband configuration to continue to estimate the DC offsets variation.

The other DC adapt blocks 520, 530 and 560 operate in a similar way, and serve to increase the Dynamic range of each associated amplifier (525, 535 and 565) by substantially cancelling the associated DC offsets.

Analog DC adapt blocks 540 and 570 are also provided for the I and Q paths respectively, and these are required in the case that A/D converters 575 and 545 do not have enough dynamic range to accept amplified DC offsets present in the analog signal.

It will be appreciated that alternative embodiments to the one described above are possible. For example, the value of the frequency shift ∂ may be different from that given above.

Furthermore, the complex LPF 210 could be replaced by one or more filters with different attributes, which result in substantially the same DC offset value.

What is claimed is:

1. A method for demodulating a radio frequency signal having a first frequency, comprising the steps of:
    oscillating demodulation means at a second frequency, the second frequency being different from the first frequency;
    measuring a DC offset value from the second frequency, the DC offset value being associated with internal interference;
    oscillating the demodulation means at the first frequency in order to demodulate the radio frequency signal, thereby providing a demodulated signal;
    subtracting the DC offset value from the demodulated signal in order to provide a demodulated signal with a substantially reduced DC component; and
    monitoring the demodulated signal for further DC offset components; and subtracting the further DC offset components from the demodulated signal.

2. The method of claim 1 wherein the step of measuring the DC offset value at the second frequency is performed by wideband low-pass filtering means and the step of monitoring the demodulated signal for further DC offset components is performed by a narrowband low-pass filtering means.

3. The method of claim 2 wherein the wideband and narrowband low-pass filtering means are provided by a single low-pass filtering means having a narrowband and a wideband mode.

4. The method of claim 3 wherein each of the low-pass filtering means is a complex filter.

5. The method of claim 2 wherein each of the low-pas filtering means is a complex filter.

6. The method of claim 2 further comprising the steps of:
    isolating the demodulation means from the radio frequency signal during the step of oscillating the demodulation means at the second frequency;
    measuring a static DC offset value which is substantially only the internal interference of the demodulation means;
    storing the static DC offset value in a storage means; and
    re-connecting the demodulation means to the radio frequency signal before the step of measuring the DC offset value from the second frequency.

7. The method of claim 6 further comprising the steps of:
    substantially removing the static DC offset value from the DC offset value before the step of subtracting the DC offset value from the demodulated signal; and
    independently subtracting the static DC offset signal from the demodulated signal.

8. The method of claim 7 further comprising the steps of:
    measuring a static DC offset value for each of a number of configurations of the demodulation means;
    storing the static DC offset values in a storage means; and
    using the stored values in dependence upon the chosen configuration.

9. The method of claim 6 further comprising the steps of:
    measuring a static DC offset value for each of a number of configurations of the demodulation means;
    storing the static DC offset values in a storage means; and
    using the stored values in dependence upon the chosen configuration.

10. The method of claim 1 further comprising the steps of:
    isolating the demodulation means from the radio frequency signal during the step of oscillating the demodulation means at the second frequency;
    measuring a static DC offset value which is substantially only the internal interference of the demodulation means;
    storing the static DC offset value in a storage means; and
    re-connecting the demodulation means to the radio frequency signal before the step of measuring the DC offset value from the second frequency.

11. The method of claim 1 wherein the second frequency is chosen to be at a frequency associated with a point of substantially minimum spectral power density of a power spectrum associated with the first frequency.

12. The demodulation arrangement of claim 1 wherein the second frequency is selected to be at a frequency associated with a point of substantially minimum spectral power density of a power spectrum associated with a frequency range of the demodulation means.

13. The demodulation arrangement of claim 1 wherein the second frequency is selected to be at a frequency associated with a point of substantially minimum spectral power density of a power spectrum associated with a frequency range of the demodulation means.

14. A demodulation arrangement for demodulating a radio frequency signal having a first frequency, the arrangement comprising:
    demodulation means arranged to oscillate at the first frequency and at a second frequency, the second frequency being different from the first frequency;
    filtering means for measuring a DC offset value from the first frequency and from the second frequency, the DC offset value being associated with interference; and
    subtracting means for subtracting the DC offset value from the demodulated signal in order to provide a demodulated signal with a substantially reduced DC component,
    wherein the demodulation means initially oscillates at the second frequency such that the filtering means measures a DC offset value substantially dependent upon internal interference.

15. The demodulation arrangement of claim 14 wherein the second frequency is chosen to be at a frequency associated with a point of substantially minimum spectral power density of a power spectrum associated with the first frequency.

16. The demodulation arrangement of claim 15 wherein the second frequency is selected to be at a frequency associated with a point of substantially minimum spectral power density of a power spectrum associated with a frequency range of the demodulation means.

17. The demodulation arrangement of claim 16 wherein the second frequency is selected to be at a frequency associated with a point of substantially minimum spectral power density of a power spectrum associated with a frequency range of the demodulation means.

* * * * *